(12) United States Patent
Nakasaki

(10) Patent No.: US 10,056,307 B2
(45) Date of Patent: Aug. 21, 2018

(54) SEMICONDUCTOR DEVICE

(71) Applicant: ROHM CO., LTD., Kyoto (JP)

(72) Inventor: Toshio Nakasaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/631,497

(22) Filed: Jun. 23, 2017

(65) Prior Publication Data

US 2018/0005908 A1    Jan. 4, 2018

(30) Foreign Application Priority Data

Jun. 29, 2016  (JP) .................... 2016-129143

(51) Int. Cl.
*H01L 21/66* (2006.01)
*H01L 23/00* (2006.01)

(52) U.S. Cl.
CPC .............. *H01L 22/32* (2013.01); *H01L 24/09* (2013.01); *H01L 24/46* (2013.01); *H01L 2924/01029* (2013.01); *H01L 2924/01079* (2013.01)

(58) Field of Classification Search
CPC ......... H01L 22/32; H01L 24/09; H01L 24/46; H01L 2924/01029; H01L 2924/01079

USPC ................................ 257/48, E23.01; 438/18
See application file for complete search history.

(56) References Cited

U.S. PATENT DOCUMENTS

| 5,554,940 A * | 9/1996 | Hubacher | G01R 1/07314 |
| | | | 324/762.03 |
| 2012/0248439 A1* | 10/2012 | Lee | H01L 23/49838 |
| | | | 257/48 |
| 2015/0115269 A1* | 4/2015 | Ishii | H01L 23/562 |
| | | | 257/48 |

FOREIGN PATENT DOCUMENTS

JP    2015-092609    5/2015

\* cited by examiner

*Primary Examiner* — Cuong Q Nguyen
*Assistant Examiner* — Tong-Ho Kim
(74) *Attorney, Agent, or Firm* — Hamre, Schumann, Mueller & Larson, P.C.

(57) ABSTRACT

A semiconductor device includes: a semiconductor element; a first bonding pad formed on a surface of the semiconductor element; a test pad formed on the surface of the semiconductor element separately from the first bonding pad and configured to be visually distinguishable from the first bonding pad; and a first bonding member connected to the first bonding pad and used for external electrical connection.

17 Claims, 13 Drawing Sheets

SEMICONDUCTOR DEVICE

CROSS-REFERENCE TO RELATED APPLICATION

This application is based upon and claims the benefit of priority from Japanese Patent Application No. 2016-129143, filed on Jun. 29, 2016, the entire contents of which are incorporated herein by reference.

TECHNICAL FIELD

The present disclosure relates to a semiconductor device.

BACKGROUND

Conventionally, electrode pads such as source pads or the like formed on the surface of a semiconductor chip are electrically connected externally via bonding wires.

In general, before a semiconductor device is shipped as a product, an electrical inspection is performed using a probe card or the like. By bringing probes of the probe card into contact with electrode pads so that a current can flow therethrough, it is possible to check whether a short circuit or disconnection has occurred in the wiring of the semiconductor device. However, during the electrical inspection, a part of the electrode pads may be raised or recessed by the contact of the probes, and probe marks may remain on the surface of the electrode pads. Therefore, in some cases, bonding wires may ride on the probe marks, and a load may not be uniformly applied to the bonding wires. In this case, due to the bonding portions of the inclined bonding wires, cratering (gouging) may occur in the electrode pads or cracks may occur under the wire bonding, which may lead to defective bonding of the bonding wires.

SUMMARY

The present disclosure provides some embodiments of a semiconductor device capable of preventing defective bonding of a bonding member such as a bonding wire or the like.

According to one embodiment of the present disclosure, there is provided a semiconductor device, including: a semiconductor element; a first bonding pad formed on a surface of the semiconductor element; a test pad formed on the surface of the semiconductor element separately from the first bonding pad and configured to be visually distinguishable from the first bonding pad; and a first bonding member connected to the first bonding pad and used for external electrical connection.

According to this configuration, the first bonding pad and the test pad are formed in such a manner that they can be distinguished from each other. Therefore, when the first bonding member such as a bonding wire or the like is connected to the first bonding pad, a pad which is not used for the electrical inspection of the semiconductor element can be easily specified as the first bonding pad. Thus, the first bonding member can be reliably made to correspond to, and can be reliably connected to, the first bonding pad. It is therefore possible to prevent defective bonding.

In the semiconductor device according to one embodiment of the present disclosure, the first bonding pad and the test pad may be formed using the same surface electrode film, and the semiconductor device may include a surface insulating film including a first opening formed on the surface electrode film and configured to expose a portion of the surface electrode film as the first bonding pad and a second opening configured to expose another portion of the surface electrode film as the test pad.

According to this configuration, the first bonding pad and the test pad can be formed at the same time by selectively removing (e.g., etching) the surface insulating film in the same manner as the process of the related art in which a pad opening is formed in a surface insulating film. Moreover, the change from the related art is nothing more than the change in the pattern of an etching mask. Thus, there is no need to increase the number of new processes.

In the semiconductor device according to one embodiment of the present disclosure, the surface electrode film may be formed using at least one of Al, Cu and Au.

In particular, Al is soft and easily leaves a trace of a probe or the like. It is therefore possible to strongly express the effects of the present disclosure.

In the semiconductor device according to one embodiment of the present disclosure, a trace remaining after an electrical inspection of the semiconductor element may be formed on a surface of the test pad. Since the first bonding member is connected to the first bonding pad as described above, there is no problem even if a trace of a probe or the like used for electrical inspection remains on the test pad.

In the semiconductor device according to one embodiment of the present disclosure, the first bonding member may include a bonding wire. The bonding wire may be a Cu wire. In the semiconductor device according to one embodiment of the present disclosure, the first bonding pad may have a first shape and the test pad may have a second shape different from the first shape. In the semiconductor device according to one embodiment of the present disclosure, one of the first bonding pad and the test pad may be formed in a polygonal shape in a plan view and the other may be formed in a circular shape in a plan view.

According to this configuration, it is possible to easily distinguish the first bonding pad and the test pad from each other by checking whether or not a corner portion is present in the pad. As a result, it is possible to easily specify a target pad in each of the electrical inspection process and the bonding process of the semiconductor element.

In the semiconductor device according to one embodiment of the present disclosure, the first bonding pad and the test pad may be formed in the same shape and may be different in size from each other.

In the semiconductor device according to one embodiment of the present disclosure, a plurality of the first bonding pads and a plurality of the test pads may be arranged in a matrix shape, and rows of the first bonding pads and rows of the test pads may be provided separately from each other. According to this configuration, it is possible to easily specify the row of the target pads in each of the electrical inspection process and the bonding process of the semiconductor element.

In the semiconductor device according to one embodiment of the present disclosure, the rows of the first bonding pads and the rows of the test pads may be alternately arranged.

The semiconductor device according to one embodiment of the present disclosure may further include: a second bonding pad integrally including a base region formed on the surface of the semiconductor element so as to be electrically insulated from the first bonding pad and having a third shape, and a test region having a fourth shape different in size from the third shape; and a second bonding member connected to the base region and used for external electrical connection.

According to this configuration, the base region and the test region of the second bonding pad are formed in different sizes from each other. Therefore, when connecting the second bonding member such as a bonding wire or the like to the base region, a region which is not used for electrical inspection of the semiconductor element can be easily specified as the base region. Thus, the second bonding member can be reliably made to correspond to, and can be reliably connected to, the base region of the second bonding pad. It is therefore possible to prevent defective bonding.

In the configuration of the second bonding pad, the base region and the test region are integrated with each other. Thus, the same effects as those of the configurations of the first bonding pad and the test pad can be obtained even in a small space. Accordingly, the configuration of the second bonding pad can be suitably adopted for, for example, a pad to which a small number of bonding wires are to be connected.

In the semiconductor device according to one embodiment of the present disclosure, the test region may have a smaller area than the base region and may include a convex region protruding from a peripheral edge of the base region.

In the semiconductor device according to one embodiment of the present disclosure, the semiconductor element may have a transistor structure including a source, a gate and a drain, the first bonding pad and the test pad may be electrically connected to the source, and the second bonding pad may be electrically connected to the gate.

In the semiconductor device according to one embodiment of the present disclosure, a trace remaining after an electrical inspection of the semiconductor element is formed on a surface of the test region.

Since the second bonding member is connected to the base region of the second bonding pad as described above, there is no problem even if a trace of a probe or the like used for electrical inspection remains in the test region.

In the semiconductor device according to one embodiment of the present disclosure, the second bonding member may include a bonding wire. The bonding wire may be an Au wire.

DETAILED DESCRIPTION

One embodiment of the present disclosure will now be described in detail with reference to the accompanying drawings.

Figure 1:
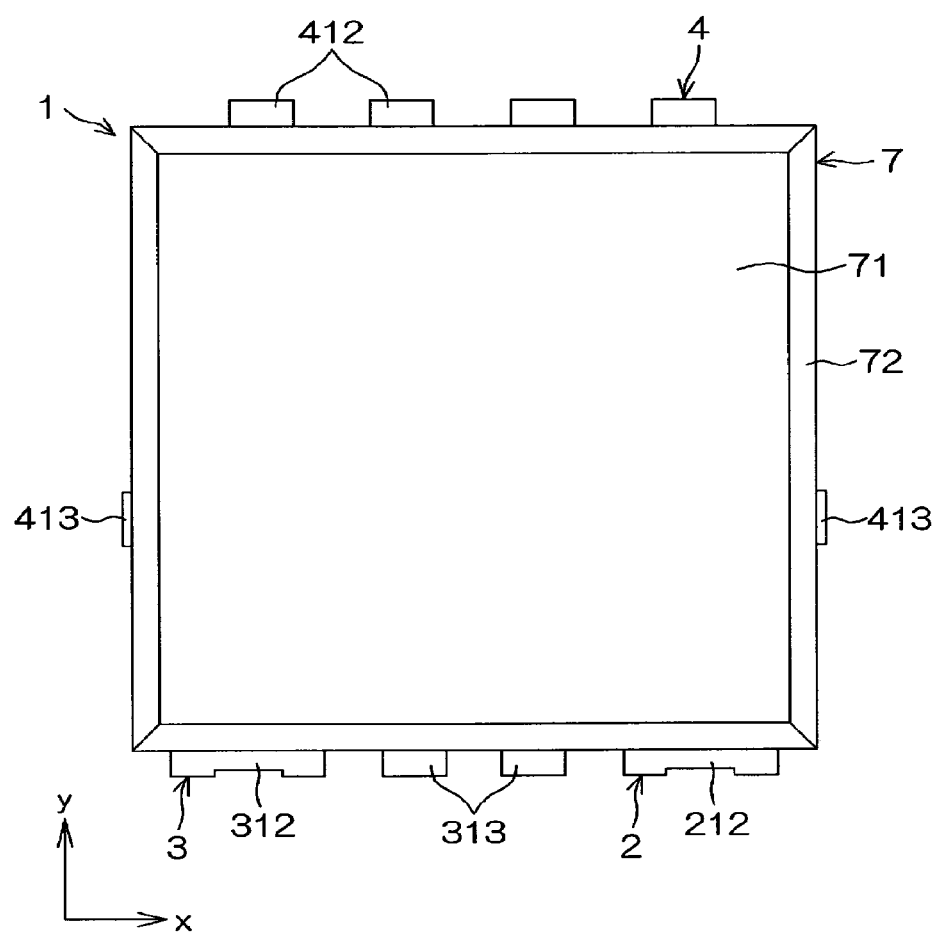
FIG. 1 is a schematic plan view of a semiconductor device according to one embodiment of the present disclosure.
Figure 2:
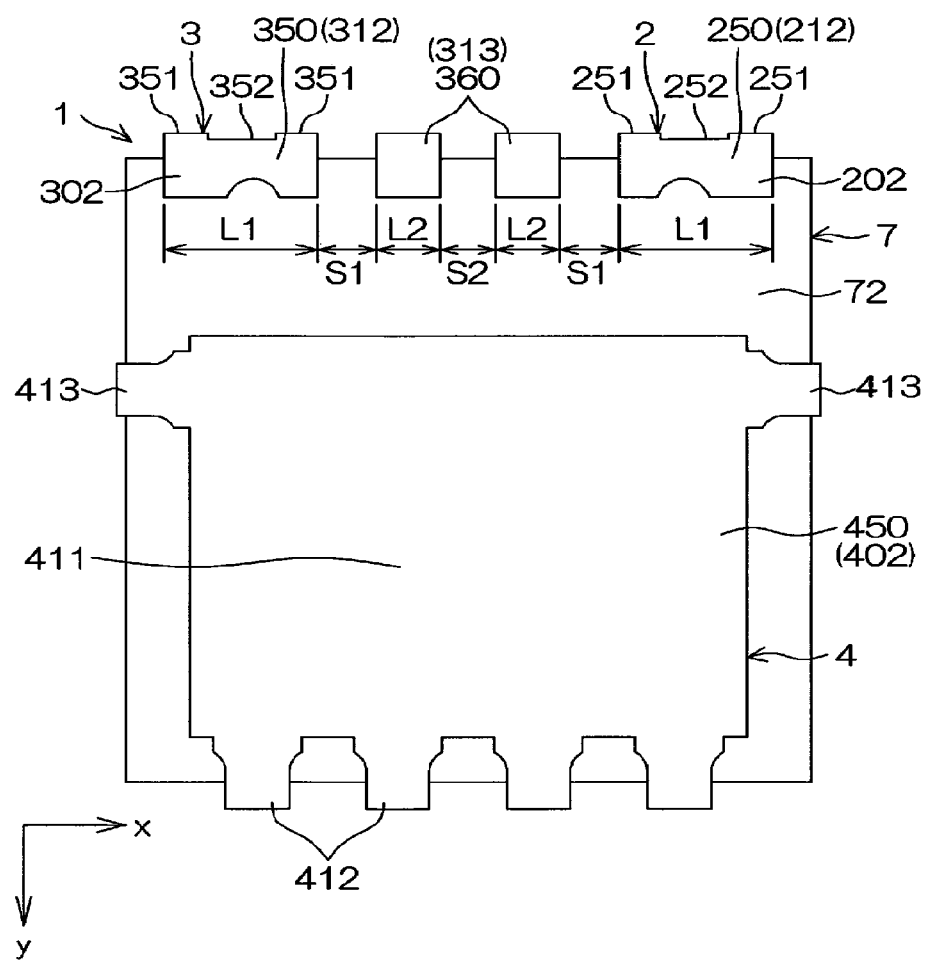
FIG. 2 is a schematic bottom view of the semiconductor device according to one embodiment of the present disclosure.
Figure 3:
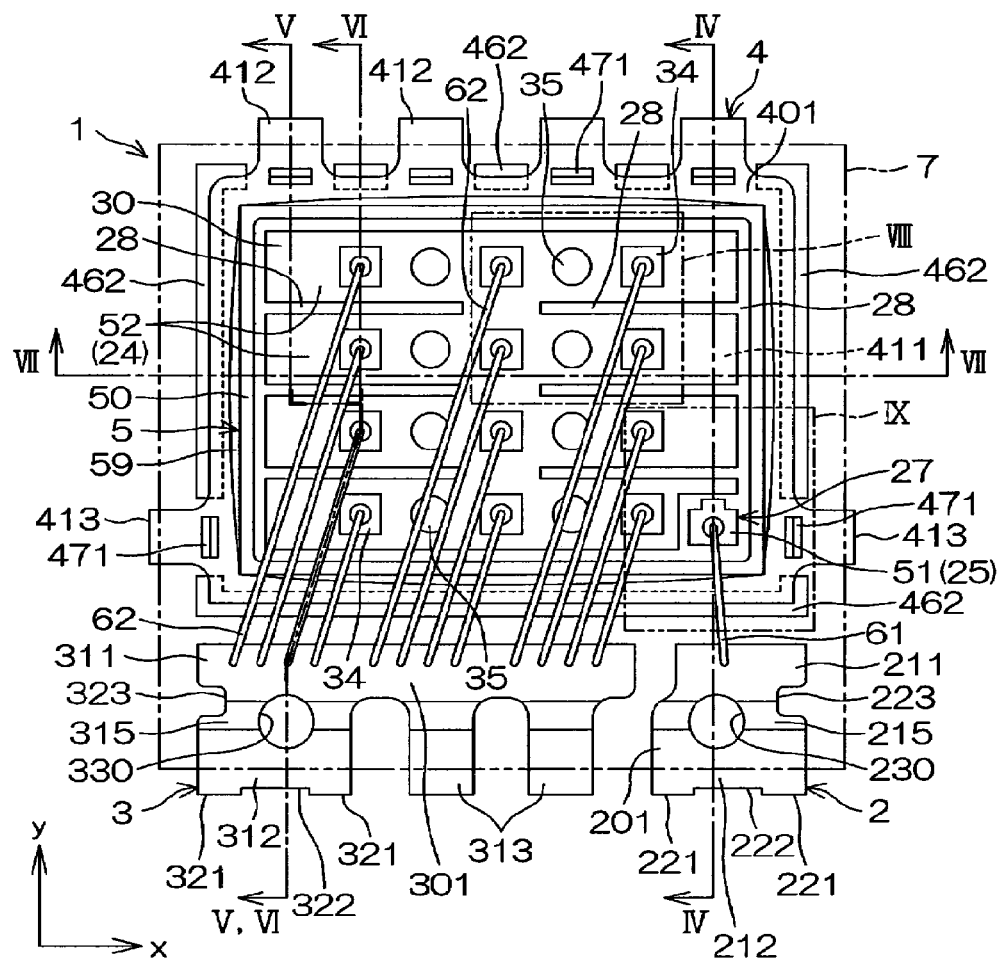
FIG. 3 is a view showing an internal structure of a resin package of the semiconductor device.
Figure 4:
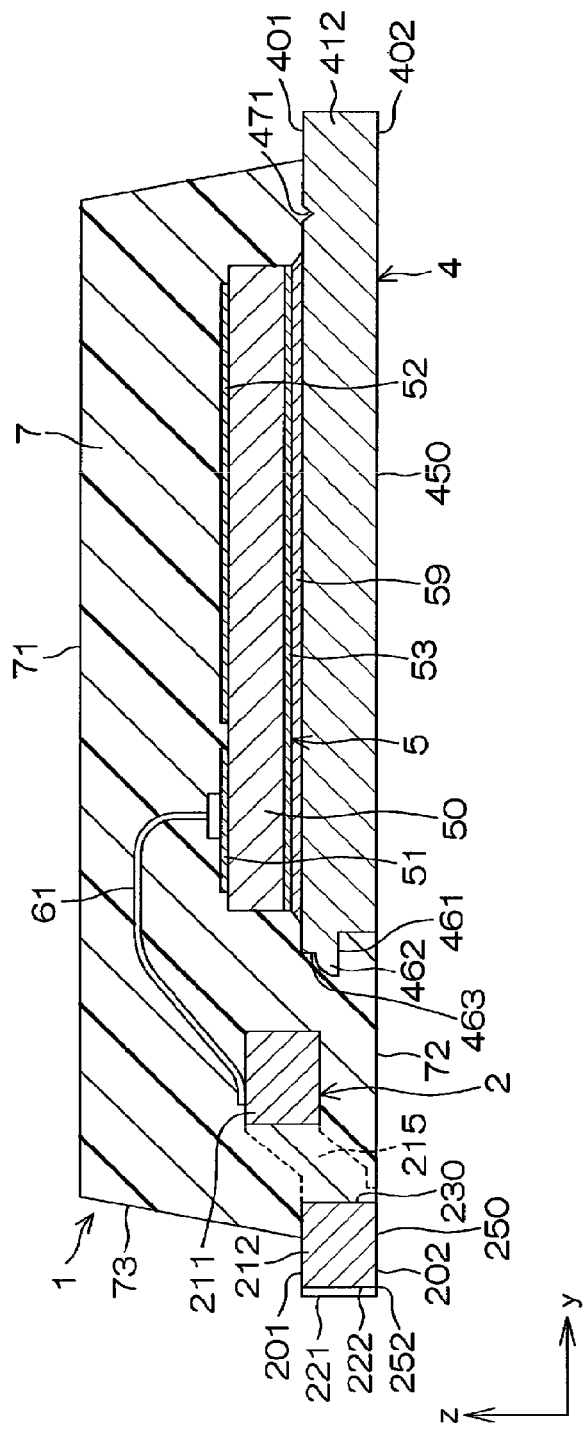
FIG. 4 is a sectional view of the semiconductor device taken along line IV-IV in FIG. 3.
Figure 5:
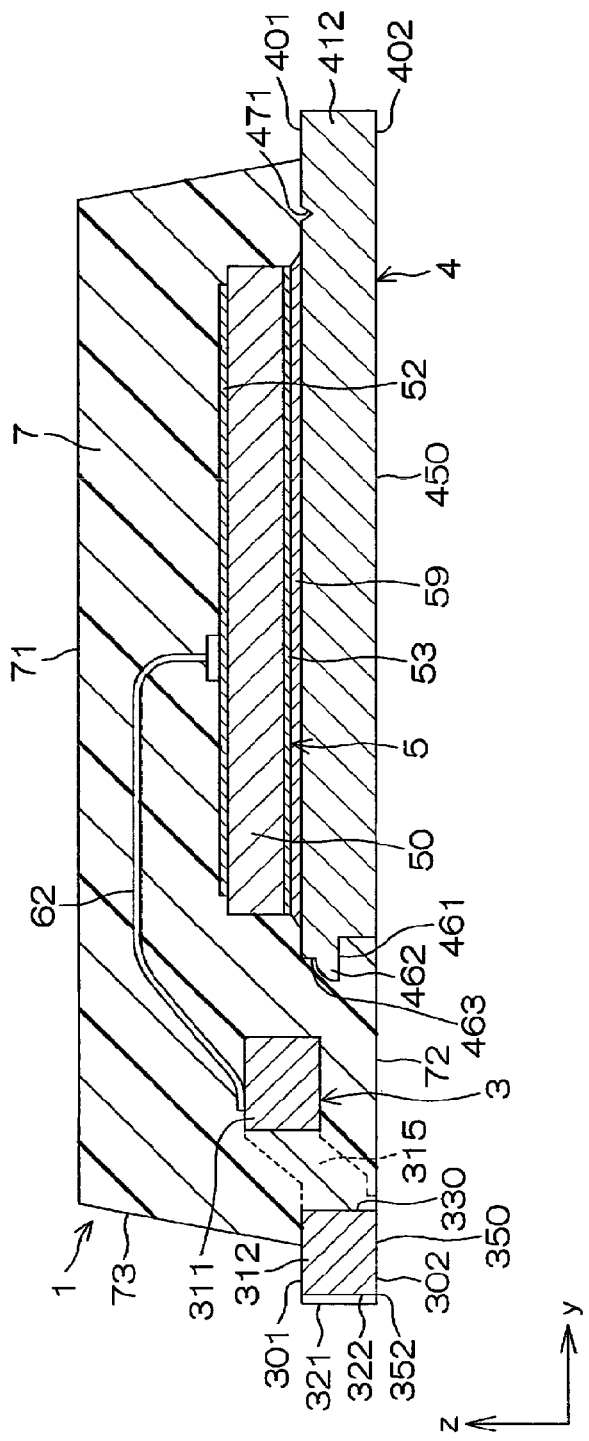
FIG. 5 is a sectional view of the semiconductor device taken along line V-V in FIG. 3.
Figure 6:
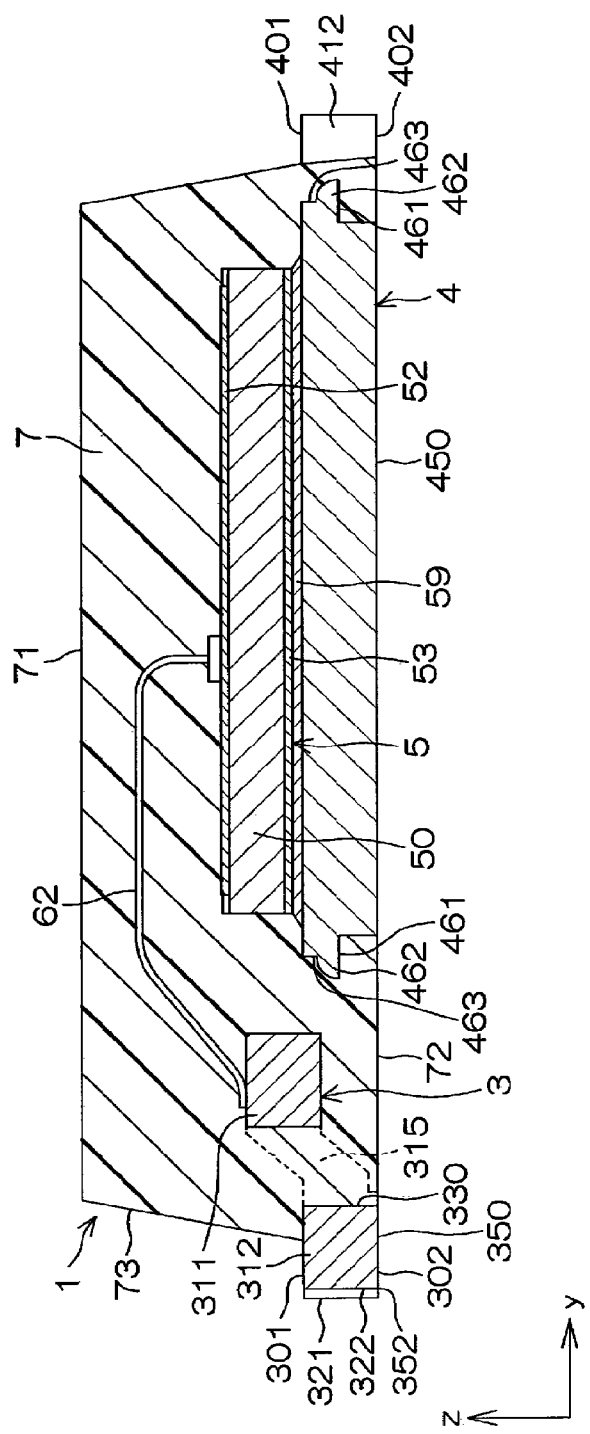
FIG. 6 is a sectional view of the semiconductor device taken along line VI-VI in FIG. 3.
Figure 7:
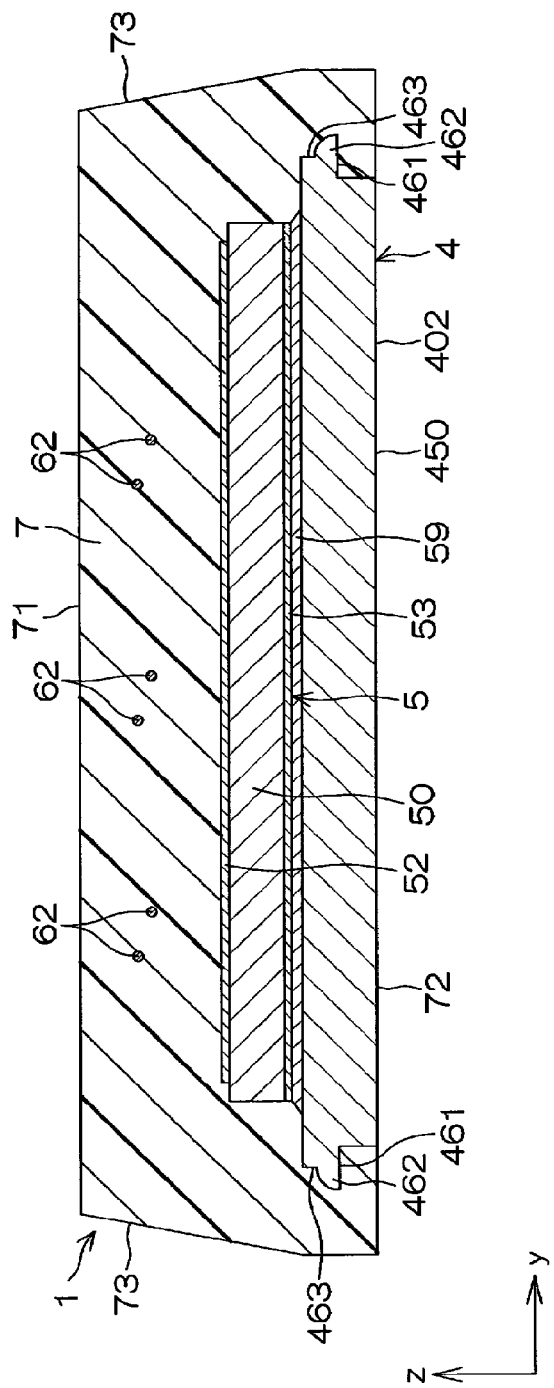
FIG. 7 is a sectional view of the semiconductor device taken along line VII-VII in FIG. 3.

FIG. 1 is a schematic plan view of a semiconductor device according to one embodiment of the present disclosure. FIG. 2 is a schematic bottom view of the semiconductor device according to one embodiment of the present disclosure. FIG. 3 is a view showing an internal structure of a resin package of the semiconductor device. FIG. 4 is a sectional view of the semiconductor device taken along line IV-IV in FIG. 3. FIG. 5 is a sectional view of the semiconductor device taken along line V-V in FIG. 3. FIG. 6 is a sectional view of the semiconductor device taken along line VI-VI in FIG. 3. FIG. 7 is a sectional view of the semiconductor device taken along line VII-VII in FIG. 3. In FIGS. 1 to 7, the x direction, the y direction and the z direction are orthogonal to each other and may be referred to as a first direction, a second direction and a thickness direction, respectively.

The semiconductor device 1 includes a plurality of leads 2, 3 and 4, a semiconductor element 5, and a resin package 7. The size of the semiconductor device 1 is not particularly limited. In this embodiment, for example, the dimension in the x direction may be from 2.6 to 3.6 mm, the dimension in they direction may be from 2.6 mm to 3.6 mm, and the dimension in the z direction may be from 0.7 mm to 1.0 mm.

The leads 2, 3 and 4 are configured to support the semiconductor element 5 and are electrically connected to the semiconductor element 5. In the following description, the leads 2, 3 and 4 will be referred to as a first lead 2, a second lead 3 and a third lead 4. The leads 2, 3 and 4 may be also referred to as a gate terminal, a source terminal and a drain terminal, respectively. The first lead 2, the second lead 3 and the third lead 4 are formed by, for example, punching or folding a metal plate. The first lead 2, the second lead 3 and the third lead 4 are made of metal and are preferably made of one of Cu and Ni, an alloy thereof, a 42 alloy or the like. The thicknesses of the first lead 2, the second lead 3 and the third lead 4 are, for example, 0.1 mm to 0.3 mm, and may be about 0.2 mm in this embodiment.

As shown in FIG. 3, the first lead 2 and the second lead 3 are arranged side by side in the x direction. The third lead 4 is spaced apart from the first lead 2 and the second lead 3 in the y direction. When viewed in the z direction, the third lead 4 has the largest dimension and the first lead 2 has the smallest dimension. As shown in FIGS. 3 and 4, the first lead 2 has a main surface 201 and a back surface 202. The main surface 201 and the back surface 202 face opposite sides in the z direction. As shown in FIG. 4, the first lead 2 includes a first wire bonding portion 211, a first terminal portion 212 and a first bent portion 215. The first wire bonding portion 211 is positioned on the facing side of the main surface 201 in the z direction with respect to the first terminal portion 212. In addition, the first wire bonding portion 211 is positioned inward in they direction with respect to the first terminal portion 212. In this embodiment, the difference in position in the z direction between the first wire bonding portion 211 and the first terminal portion 212 is about 0.15 mm. The first bent portion 215 connects the first wire bonding portion 211 and the first terminal portion 212, and has a bent shape when viewed in the x direction.

The first terminal portion 212 includes two first distal end surfaces 221 and one first concave end surface 222. The first distal end surfaces 221 are surfaces that face outward in the y direction. The first concave end surface 222 is a surface recessed inward in the y direction with respect to the first distal end surfaces 221 when viewed in the z direction. The first concave end surface 222 is sandwiched between the two first distal end surfaces 221 in the x direction. As shown in FIG. 2, the portion of the back surface 202 that belongs to the first terminal portion 212 constitutes an outer back surface mounting portion 250. The outer back surface mounting portion 250 is exposed from the resin package 7 and is a portion to be bonded by a solder when the semiconductor device 1 is mounted on a circuit board. The outer back surface mounting portion 250 includes distal edges 251 which are boundary edges adjoining the first distal end surfaces 221 and a concave edge 252 which is a boundary edge adjoining the first concave end surface 222.

As shown in FIGS. 3 and 4, the first lead 2 has a first concave side surface 223 (FIG. 3) and a first through-hole 230. The first concave side surface 223 is recessed inward from the outer side in the x direction when viewed in the z direction. The first concave side surface 223 overlaps with the first wire bonding portion 211 and the first bent portion 215 when viewed in the z direction. The first through-hole 230 penetrates the first lead 2 in the z direction. When viewed in the z direction, the first through-hole 230 overlaps with the first bent portion 215. In addition, the first through-hole 230 overlaps with the first wire bonding portion 211 and the first terminal portion 212 when viewed in the z direction.

A part of the main surface 201 may be covered with a first main surface plating layer (not shown). The first main surface plating layer is formed of, for example, an Ag plating layer. In this embodiment, the portions of the main surface 201 that belong to the first wire bonding portion 211 and the first bent portion 215 are covered with the first main surface plating layer. The back surface 202 may be covered with a first back surface plating layer (not shown). The first concave end surface 222 may be covered with a first side surface plating layer (not shown). In addition, the first side surface plating layer exposes the two first distal end surface 221. The first back surface plating layer and the first side surface plating layer are made of the same material and are connected to each other. The first main surface plating layer is made of a material different from the material of the first back surface plating layer and the first side surface plating layer. The first back surface plating layer and the first side surface plating layer may be formed of, for example, a Sn plating layer.

As shown in FIGS. 3 and 5, the second lead 3 includes a main surface 301 and a back surface 302. The main surface 301 and the back surface 302 face opposite sides in the z direction. As shown in FIG. 5, the second lead 3 includes a second wire bonding portion 311, a second outer terminal portion 312, two second inner terminal portions 313, and three second bent portions 315. The second wire bonding portion 311 is positioned on the facing side of the main surface 301 in the z direction with respect to the second outer terminal portion 312 and the two second inner terminal portions 313. The second wire bonding portion 311 is positioned inward in the y direction with respect to the second outer terminal portion 312 and the two second inner terminal portions 313. In this embodiment, the difference in position in the z direction between the second wire bonding portion 311, the second outer terminal portion 312 and the two second inner terminal portions 313 is about 0.15 mm. The three second bent portions 315 connect the second wire bonding portion 311 to the second outer terminal portion 312 and the two second inner terminal portions 313 and have a bent shape when viewed in the x direction. The second outer terminal portion 312 is positioned to be the outermost terminal in the x direction. The two second inner terminal portions 313 are located inward in the x direction with respect to the second outer terminal portion 312 and are arranged side by side in the x direction. In addition, the two second inner terminal portions 313 are sandwiched between the first terminal portion 212 and the second outer terminal portion 312 in the x direction.

The second outer terminal portion 312 includes two second distal end surfaces 321 and one second concave end surface 322. The second distal end surfaces 321 are surfaces that face outward in the y direction. The second concave end surface 322 is a surface recessed inward in the y direction with respect to the second distal end surfaces 321 when viewed in the z direction. The second concave end surface 322 is sandwiched between two second distal end surfaces 321 in the x direction. As shown in FIG. 2, the portion of the back surface 302 that belongs to the second outer terminal portion 312 constitutes an outer back surface mounting portion 350. The outer back surface mounting portion 350 is exposed from the resin package 7 and is a portion to be bonded by a solder when the semiconductor device 1 is mounted on a circuit board. The outer back surface mounting portion 350 includes second distal edges 351 which are boundary edges adjoining the second distal end surfaces 321 and a second concave edge 352 which is a boundary edge adjoining the second concave end surface 322.

As shown in FIG. 2, the portions of the back surface 302 belonging to the two second inner terminal portions 313 constitute two inner back surface mounting portions 360. The inner back surface mounting portions 360 are exposed from the resin package 7 and are portions to be bonded by a solder when the semiconductor device 1 is mounted on a circuit board. As shown in FIGS. 3 and 5, the second lead 3 includes a second concave side surface 323 and a second through-hole 330. The second concave side surface 323 is recessed inward from the outer side in the x direction when viewed in the z direction. The second concave side surface 323 overlaps with the second wire bonding portion 311 and the second bent portion 315 when viewed in the z direction. The second through-hole 330 penetrates the second lead 3 in the z direction. When viewed in the z direction, the second through-hole 330 overlaps with the second bent portion 315. In addition, the second through-hole 330 overlaps with the second wire bonding portion 311 and the second outer terminal portion 312 when viewed in the z direction.

A part of the main surface 301 may be covered with a second main surface plating layer (not shown). The second main surface plating layer is formed of, for example, an Ag plating layer. In this embodiment, the portions of the main surface 301 that belong to the second wire bonding portion 311 and the second bent portion 315 are covered with the second main surface plating layer. The back surface 302 may be covered with a second back surface plating layer (not shown). The second concave end surface 322 may be covered with a second side plating layer (not shown). In addition, the second side plating layer exposes the two second distal end surfaces 321. In addition, the second side plating layer exposes the distal end surface of the inner back surface mounting portion 360. The second back surface plating layer and the second side surface plating layer are made of the same material and are connected to each other. The second main surface plating layer is made of a material different from the material of the second back surface plating layer and the second side surface plating layer. The second back surface plating layer and the second side surface plating layer may be formed of, for example, a Sn plating layer.

As shown in FIG. 2, the outer back surface mounting portion 250 and the outer back surface mounting portion 350 are the outermost portions on both sides in the x direction, and the two inner back surface mounting portions 360 are disposed between the outer back surface mounting portion 250 and the outer back surface mounting portion 350. An example of the dimensions and areas of the outer back surface mounting portion 250, the outer back surface mounting portion 350 and the inner back surface mounting portions 360 will be described below.

The dimension L1 in the x direction of the outer back surface mounting portion 250 and the outer back surface mounting portion 350 shown in FIG. 2 is about 0.7 mm, and the dimension L2 in the x direction of the inner back surface mounting portions 360 is about 0.3 mm. The distance between the outer back surface mounting portion 250 and the inner back surface mounting portion 360 is the same as the distance between the outer back surface mounting portion 350 and the inner back surface mounting portions 360, and the dimension S1 thereof is 0.27 mm. The dimension S2, which is the distance between the two inner back surface mounting portions 360, is 0.27 mm, which is equal to the dimension S1. The dimension ratio R2 of the dimensions L1 and L2 when the dimension L2 is assumed to be 1 is 2.33. The dimension ratio R2 is preferably 1.7 to 2.5. In this embodiment, the dimensions in the y direction of the outer back surface mounting portion 250, the outer back surface mounting portion 350, and the two inner back surface mounting portions 360 are the same. The outer back surface mounting portion 250 and the outer back surface mounting portion 350 have a long rectangular shape whose longitudinal direction is the x direction. The two inner back surface mounting portions 360 have a short rectangular shape with the degree of flatness thereof smaller than that of the outer back surface mounting portion 250 and the outer back surface mounting portion 350.

The areas of the outer back surface mounting portion 250 and the outer back surface mounting portion 350 are equal to each other. The area E1 thereof is 0.222 mm$^2$. The area E2 of the two inner back surface mounting portions 360 is 0.096 mm$^2$. The area ratio R1 of the area E1 when the area E2 is assumed to be 1 is 2.31. The area ratio R1 is preferably 1.7 to 2.5. The ratio R3 of the dimension ratio R2 when the area ratio R1 is assumed to be 1 is 1.01. The ratio R3 is preferably 0.68 to 1.47.

Referring to FIGS. 3 to 7, the third lead 4 includes a main surface 401 and a back surface 402. As shown in FIGS. 4 to 7, the main surface 401 and the back surface 402 face opposite sides in the z direction. The third lead 4 includes an element bonding portion 411, a plurality of terminal-like extension portions 412, and two lateral extension portions 413. For example, the element bonding portion 411 has a rectangular shape when viewed in the z direction, and the semiconductor element 5 is mounted on the element bonding portion 411. The respective terminal-like extension portions 412 extend in the y direction from the element bonding portion 411 and are arranged side by side in the x direction. The two lateral extension portions 413 extend from the element bonding portion 411 toward both sides in the x direction.

As shown in FIG. 2, the portion of the back surface 402, which is exposed from the resin package 7, constitutes an element-side back surface mounting portion 450. In this embodiment, the entire back surface 402 constitutes the element-side back surface mounting portion 450. The element-side back surface mounting portion 450 is a portion to be joined by solder when the semiconductor device 1 is mounted on a circuit board. As shown in FIGS. 4 to 7, the third lead 4 includes a back surface side concave portion 461, an eave portion 462, and a main-surface-side intermediate end surface 463.

The back surface side concave portion 461 is recessed in the z direction from the back surface 402 at the end portion of the third lead 4 when viewed in the z direction. The eave portion 462 is connected to the main surface 401 side in the z direction with respect to the back surface side concave portion 461 and protrudes outward when viewed in the z direction. The main-surface-side intermediate end surface 463 is interposed between the main surface 401 and the eave portion 462 and is located inward with respect to the eave portion 462 when viewed in the z direction. The main-surface-side intermediate end surface 463 overlaps with the back surface side concave portion 461 when viewed in the thickness direction.

In this embodiment, the back surface side concave portion 461, the eave portion 462 and the main-surface-side intermediate end surface 463 are provided in the edge of the third lead 4 on the side of the first lead 2 and the second lead 3 when viewed in the z direction, in the edge on both sides of the third lead 4 in the x direction, and in the regions between the terminal-like extension portions 412 at the edge of the third lead 4 on the opposite side of the first lead 2 and the second lead 3 in the y direction. As shown in FIG. 3, the third lead 4 includes a plurality of main surface side concave portions 471. The main surface side concave portions 471 are provided in the positions avoiding the semiconductor element 5 when viewed in the z direction and are recessed in the thickness direction from the main surface 401. In this embodiment, the main surface side concave portions 471 are provided in the root portions of the terminal-like extension portions 412 and the two lateral extension portions 413.

The main surface 401 of the third lead 4 may be covered with a third main surface plating layer (not shown). The third main surface plating layer may be provided in the portion of the main surface 401 excluding the portions belonging to the terminal-like extension portions 412. The third main surface plating layer is formed of, for example, an Ag plating layer. The back surface 402 may be covered with a third back surface plating layer. The portion of the side surface of the third lead 4 excluding the distal end surfaces of the terminal-like extension portions 412 and the distal end surfaces of the two lateral extension portions 413 may be covered with a third side surface plating layer. The third back surface plating layer and the third side surface plating layer are made of the same material and are connected to each other. The third main surface plating layer is made of a material different from the material of the third back surface plating layer and the third side surface plating layer. The third back surface plating layer and the third side surface plating layer may be formed of, for example, a Sn plating layer.

The semiconductor element 5 is an element that exerts an electrical function of the semiconductor device 1. The type of the semiconductor element 5 is not particularly limited. As shown in FIG. 3, in this embodiment, the semiconductor element 5 is configured as a transistor. The semiconductor element 5 includes an element body 50, a first electrode 51, a second electrode 52, and a third electrode 53. The first electrode 51 and the second electrode 52 are provided on the surface of the element body 50 that faces the same side as the main surface 301. The third electrode 53 is provided on the surface of the element body 50 that faces the same side as the back surface 302. In this embodiment, the first electrode 51 is a gate electrode, the second electrode 52 is a source electrode, and the third electrode 53 is a drain electrode.

The semiconductor device 1 includes a first wire 61 as an example of a second bonding member of the present disclosure and a plurality of second wires 62 as an example of a first bonding member of the present disclosure. The first wire 61 is connected to the first electrode 51 and the first wire bonding portion 211 of the first lead 2. The second wires 62 are connected to the second electrode 52 and the second wire bonding portion 311 of the second lead 3.

The third electrode 53 is mounted on the element bonding portion 411 of the third lead 4 via a conductive bonding material 59. More specifically, the conductive bonding material 59 bonds the third electrode 53 and the third main surface plating layer (not shown) provided on the main surface 401 of the element bonding portion 411. The resin package 7 covers parts of the first lead 2, the second lead 3 and the third lead 4, the semiconductor element 5, the first wire 61, and the second wires 62. The resin package 7 is made of, for example, a black epoxy resin.

As shown in FIGS. 1, 2 and 6, the resin package 7 includes a package main surface 71, a package back surface 72, and a package side surface 73. The package main surface 71 and the package back surface 72 face opposite sides in the z direction. The package main surface 71 faces the same side as the main surface 201, the main surface 301 and the main surface 401. The package back surface 72 faces the same side as the back surface 202, the back surface 302 and the back surface 402. The package side surface 73 is connected to the package main surface 71 and the package back surface 72 and is slightly inclined with respect to the z direction.

The outer back surface mounting portion 250, the outer back surface mounting portion 350, the two inner back surface mounting portions 360 and the element-side back surface mounting portion 450 are exposed from the resin package 7. In addition, the outer back surface mounting portion 250, the outer back surface mounting portion 350, the two inner back surface mounting portions 360 and the element-side back surface mounting portion 450 are flush with the package back surface 72 of the resin package 7.

Next, the configuration of the semiconductor element 5 will be described more specifically with reference to FIG. 3 and FIGS. 8 to 11.

Figure 8:
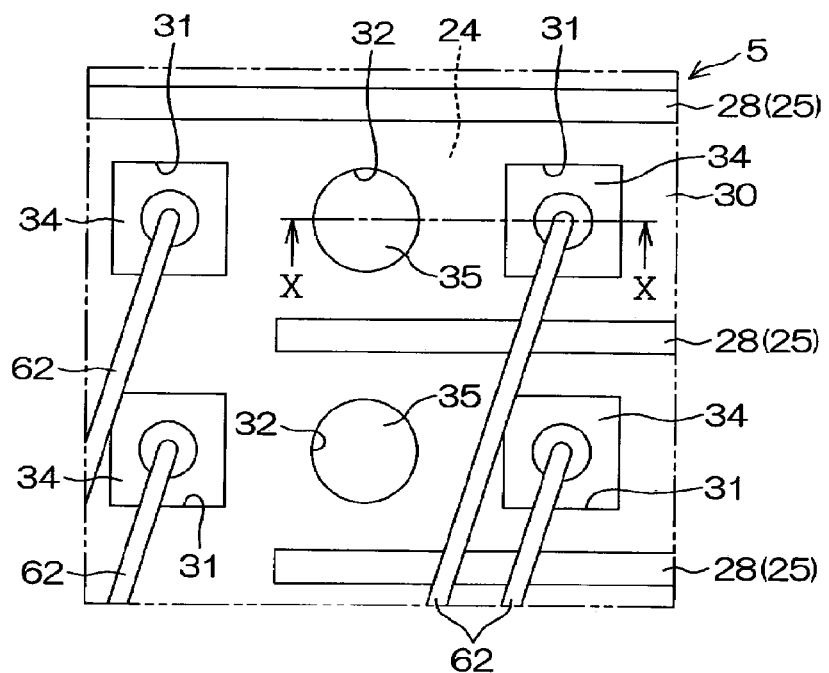
FIG. 8 is an enlarged view of a portion surrounded by a two-dot chain line VIII in FIG. 3.
Figure 9:
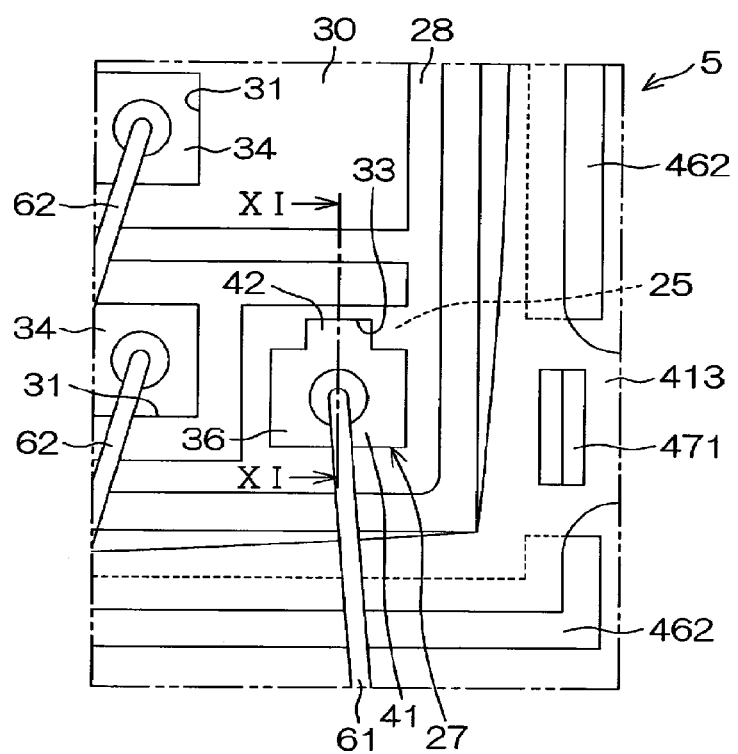
FIG. 9 is an enlarged view of a portion surrounded by a two-dot chain line IX in FIG. 3.
Figure 10:
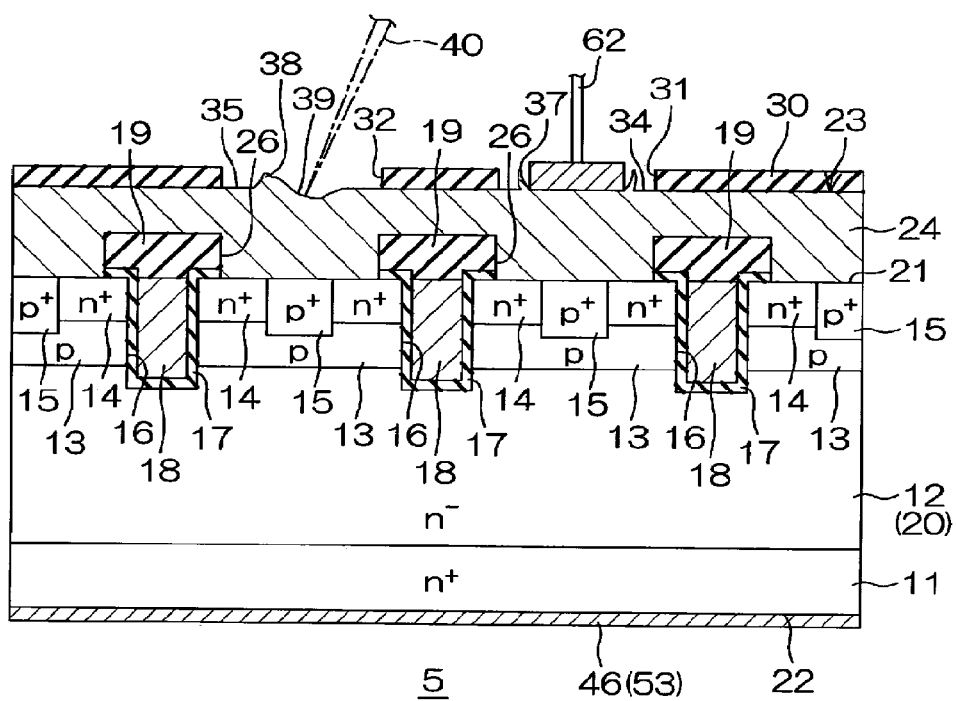
FIG. 10 is a sectional view of the semiconductor element taken along line X-X in FIG. 8.
Figure 11:
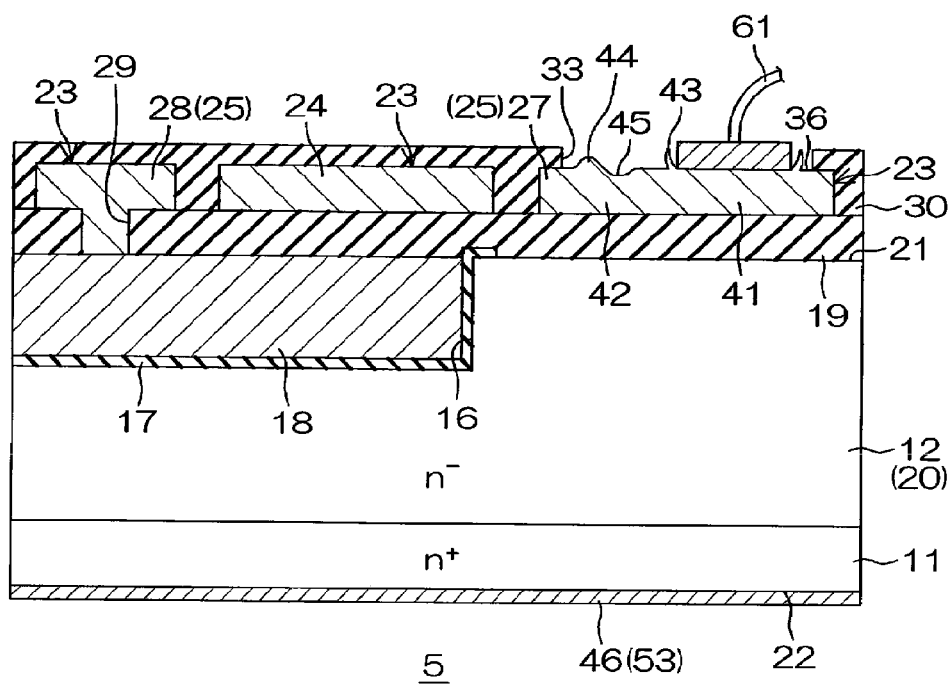
FIG. 11 is a sectional view of the semiconductor element taken along line XI-XI in FIG. 9.

FIG. 8 is an enlarged view of a portion surrounded by a two-dot chain line VIII in FIG. 3. FIG. 9 is an enlarged view of a portion surrounded by a two-dot chain line IX in FIG. 3. FIG. 10 is a sectional view of the semiconductor element 5 taken along line X-X in FIG. 8. FIG. 11 is a sectional view of the semiconductor element 5 taken along line XI-XI in FIG. 9. The semiconductor element 5 is an MIS transistor made of Si, SiC, GaN or the like, and includes an $n^+$ type substrate 11, an $n^-$ type semiconductor layer 12, a p type body region 13, an $n^+$ type source region 14, a $p^+$ type body contact region 15, a gate trench 16, a gate insulating film 17, a gate electrode 18, and an interlayer insulating film 19.

On the back surface 22 of the $n^+$ type substrate 11 as a drain of the semiconductor element 5, a back surface metal 46 is formed. The back surface metal 46 may include the aforementioned third electrode 53. That is to say, all or a part of the back surface metal 46 may be the aforementioned third electrode 53. The $n^-$ type semiconductor layer 12 is formed on the $n^+$ type substrate 11. The p type body region 13 is formed in the surface portion of the $n^-$ type semiconductor layer 12, and the $n^+$ type source region 14 is formed in the surface portion of the p type body region 13. The $p^+$ type body contact region 15 penetrates the $n^+$ type source region 14 and reaches the p type body region 13. As a result, the $p^+$ type body contact region 15 is electrically connected to the p type body region 13. In then type semiconductor layer 12, the $n^-$ type region other than the p type body region 13, the $n^+$ type source region 14 and the $p^+$ type body contact region 15 may be referred to as an $n^-$ type drift region 20.

The gate trench 16 extends from the surface 21 of then type semiconductor layer 12 through the $n^+$ type source region 14 and the p type body region 13 and reaches the $n^-$ type drift region 20. The gate trench 16 may be formed, for example, in a lattice shape or a stripe shape in a plan view. In this embodiment, the gate trench 16 is formed in a lattice shape. FIGS. 10 and 11 show a cross section along the transverse direction and a cross section along the longitudinal direction of the lattice-shaped gate trench 16, respectively.

The gate insulating film 17 is made of an insulating material such as, for example, $SiO_2$ or the like, and is formed on the inner surface of the gate trench 16. In the gate trench 16, the gate electrode 18 is buried inside the gate insulating film 17. The gate electrode 18 is made of a conductive material such as, for example, polysilicon or the like. The interlayer insulating film 19 is made of an insulating material such as, for example, $SiO_2$ or the like, and is formed on the surface 21 of the $n^-$ type semiconductor layer 12.

On the interlayer insulating film 19, a surface electrode film 23 is formed. The surface electrode film 23 is formed using, for example, at least one of Al, Cu, and Au, and may be formed using an alloy containing these metals. The surface electrode film 23 includes a source metal 24 and a gate metal 25 which are separated from each other. The source metal 24 and the gate metal 25 may include the second electrode 52 and the first electrode 51, respectively. That is to say, all or a part of the source metal 24 and the gate metal 25 may be the above-described second electrode 52 and the first electrode 51.

The source metal 24 is formed substantially over the entire surface of the semiconductor element 5 and is formed, for example, in a substantially quadrangular shape in a plan view. As shown in FIG. 10, the source metal 24 is connected to the $n^+$ type source region 14 and the $p^+$ type body contact region 15 via a contact hole 26 formed in the interlayer insulating film 19. The gate metal 25 includes a pad portion 27 disposed at one corner portion of the source metal 24, and a finger portion 28 extending from the pad portion 27. The finger portion 28 extends so as to surround the source metal 24 and further branches at a plurality of locations toward the inner region of the source metal 24. As shown in FIG. 11, the finger portion 28 is connected to the gate electrode 18 via a contact hole 29 formed in the interlayer insulating film 19.

A surface insulating film 30 is formed so as to cover the surface electrode film 23. The surface insulating film 30 is made of an insulating material such as, for example, SiN or the like. As shown in FIGS. 8 to 11, the surface electrode film 23 has pad openings 31 to 33 for partially exposing the source metal 24 and the gate metal 25. Specifically, a part of the source metal 24 is exposed as a source connection pad 34 as an example of the first bonding pad of the present disclosure from the pad opening 31 as an example of the first opening of the present disclosure. A part of the source metal 24 is exposed as a source test pad 35 as an example of the test pad of the present disclosure from the pad opening 32 as an example of the second opening of the present disclosure. A part of the gate metal 25 (pad portion 27) is exposed as a gate pad 36 as an example of the second bonding pad of the present disclosure from the pad opening 33.

Both the source connection pad 34 and the source test pad 35 are made of a part of the source metal 24 and are electrically connected to each other below the surface insulating film 30. However, the source connection pad 34 and the source test pad 35 are separated from each other in a plan view and have different shapes. In this embodiment, the source connection pad 34 is formed in a quadrangular shape in a plan view as an example of the first shape of the present disclosure, and the source test pad 35 is formed in a circular shape in a plan view as an example of the second shape of the present disclosure. Such a shape is obtained by etching the surface insulating film 30 so that the pad opening 31 and the pad opening 32 have a quadrangular shape or a circular shape.

As shown in FIG. 3, a plurality of source connection pads 34 and a plurality of source test pads 35 are arranged in a matrix shape in the upper surface region of the source metal 24. In this embodiment, the rows of the source connection pads 34 and the rows of the source test pads 35 are provided separately from each other and are arranged alternately. In FIG. 3, the rows of the source connection pads 34, each of which has a set of four source connection pads 34, and the rows of the source test pads 35, each of which has a set of four source test pads, are alternately arranged from the left side of the drawing sheet.

The second wire 62 is connected to the source connection pad 34. Since the current flowing to a source is larger than the current flowing to a gate, it is preferable to use, as the second wire 62, a Cu wire having a relatively high electrical conductivity. In the source connection pad 34, a splash portion 37 composed of a part of the source metal 24 may be formed around the connection portion with the second wire 62. The splash portion 37 is formed by, for example, extruding a part of the source metal 24 toward the periphery of the bonding portion of the second wire 62 by ultrasonic vibration applied at the time of bonding the second wire 62.

On the other hand, various connection members such as wires or the like may not be connected to the source test pad 35. The source test pad 35 may be in a completely exposed state. Needless to say, a joining member such as a wire or the like may be connected to the source test pad 35 as long as a defect does not occur in the semiconductor element 5. In addition, a raised portion 38 made of a part of the source metal 24 and a recessed portion 39 positioned on one side of the raised portion 38 may be continuously formed in the source test pad 35. The raised portion 38 and the recessed portion 39 are formed, for example, during the electrical inspection of the semiconductor element 5. In other words, as shown in FIG. 10, when the semiconductor element 5 is electrically inspected, a probe 40 of a probe card is brought into contact with the source test pad 35 so that a current can flow. The raised portion 38 and the recessed portion 39 may remain as a trace of the contact of the probe 40 in some cases. The probe 40 is used for the electrical inspection of the semiconductor element 5 and does not remain as a part of the semiconductor element 5 after inspection.

The gate pad 36 integrally includes a base region 41 and a test region 42 having a shape different in size from the base region 41. In this embodiment, the base region 41 is formed in a quadrangular shape in a plan view as an example of the third shape of the present disclosure. The test region 42 protrudes from the periphery of the base region 41 and is formed in a quadrangular shape in a plan view as an example of the fourth shape of the present disclosure so as to have an area smaller than that of the base region 41. In other words, the gate pad 36 has a shape in which rectangular regions having different areas are stacked in two stages. It is not necessary that the base region 41 and the test region 42 are formed in the same shape (quadrangular shape in this embodiment). For example, a test region 42 having a semicircular shape in a plan view may protrude from the peripheral edge of the base region 41 having a quadrangular shape in a plan view. A test region 42 having a quadrangular shape in a plan view may protrude from the peripheral edge of the base region 41 having a circular shape in a plan view.

The first wire 61 is connected to the base region 41. Since the current flowing to a gate is relatively small, an Au wire having a smaller electrical conductivity than a Cu wire may be used as the first wire 61. In the base region 41, a splash portion 43 composed of a part of the gate metal 25 may be formed around the connection portion with the first wire 61. The splash portion 43 is formed by, for example, extruding a part of the gate metal 25 toward the periphery of the bonding portion of the first wire 61 by ultrasonic vibration applied at the time of bonding the first wire 61.

On the other hand, various connection members such as wires or the like may not be connected to the test region 42. The test region 42 may be in a completely exposed state. Needless to say, a joining member such as a wire or the like may be connected to the test region 42 as long as a defect does not occur in the semiconductor element 5. In addition, a raised portion 44 made of a part of the gate metal 25 and a recessed portion 45 positioned on one side of the raised portion 44 may be continuously formed in the test region 42. The generation principle of the raised portion 44 and the recessed portion 45 is similar to the generation principle of the raised portion 38 and the recessed portion 39 of the source test pad 35 described above.

As described above, according to the semiconductor device 1, the source connection pad 34 and the source test pad 35 are formed in different shapes from each other. Therefore, when connecting the second wire 62 to the source connection pad 34, a pad which is not used for the electrical inspection of the semiconductor element 5 and which has a smooth surface without irregularities such as the raised portion 38 and the recessed portion 39 can be easily specified as the source connection pad 34. In addition, since the source connection pad 34 has a quadrangular shape and the source test pad 35 has a circular shape, it is possible to easily distinguish the source connection pad 34 and the source test pad 35 by merely checking whether there is a corner portion on the pad. For example, it is possible to easily distinguish the source connection pad 34 and the source test pad 35 by observing the upper surface of the semiconductor element 5 with a camera or the like before each of the electrical inspection process and the bonding process of the semiconductor element 5. This makes it possible to easily specify a target pad in each of the electrical inspection process and the bonding process of the semiconductor element 5. As a result, in the bonding process, if the position of the source connection pad 34 is predetermined by specifying the coordinates thereof, the second wire 62 can be reliably made to correspond to, and can be reliably connected to, the source connection pad 34. It is therefore possible to prevent defective bonding of the wire.

Furthermore, the source connection pad 34 and the source test pad 35 can be formed at the same time by selectively removing (e.g., etching) the surface insulating film 30. The change from the related art is nothing more than the change in the pattern of an etching mask. Thus, there is no need to increase the number of new processes. On the other hand, in the gate pad 36, the base region 41 and the test region 42 are formed with different sizes. Therefore, when connecting the first wire 61 to the base region 41, a region which is not used for the electrical inspection of the semiconductor element 5 and which has a smooth surface without irregularities such as the raised portion 44 and the recessed portion 45 can be easily specified as the base region 41. As a result, the first wire 61 can be reliably made to correspond to, and can be reliably connected to, the base region 41. It is therefore possible to prevent defective connection of the wire.

Moreover, in the configuration of the gate pad 36, the base region 41 and the test region 42 are integral with each other. It is therefore possible to obtain the same effects as those of the configurations of the source connection pad 34 and the source test pad 35 even in a small space. Accordingly, the configuration of the gate pad 36 can be suitably employed in the gate metal 25 having a smaller number of bonding wires to be connected. On the other hand, in the case of the source metal 24, the number of bonding wires to be connected is large. Thus, with respect to the source metal 24, it is preferable to separate the source connection pad 34 and the source test pad 35 from each other.

The test region 42 of the gate pad 36 is formed to be relatively small from the viewpoint of space saving. Thus, there may be a case where it is difficult to position the probe at the time of electrical inspection of the semiconductor element 5. In such a case, the positioning problem can be solved by using a probe card having a plurality of probes capable of collectively inspecting the electrical characteristics of a source and a gate. In other words, if the relative position of the gate probe with respect to the source probe is fixed in the probe card, it is possible to make sure that when the source probe of the probe card is brought into contact with the source test pad 35, the gate probe inevitably makes contact with the test region 42 of the gate pad 36.

Figure 12:
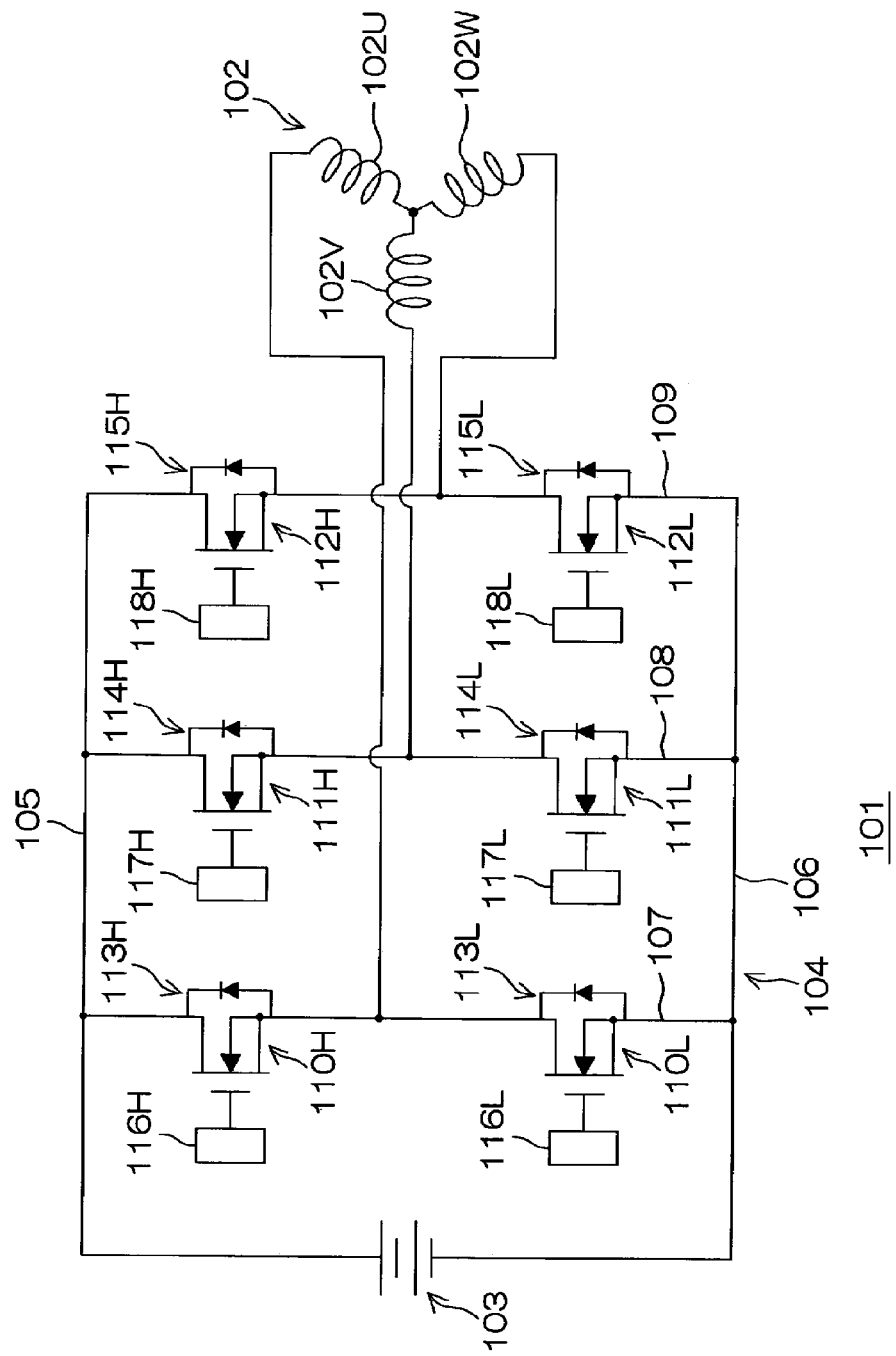
FIG. 12 is an inverter circuit diagram in which the semiconductor device is incorporated.

The semiconductor device 1 can be used by incorporating the same into, for example, an inverter circuit as shown in FIG. 12. FIG. 12 is an inverter circuit diagram in which the semiconductor device 1 is incorporated. The inverter circuit 101 is a three-phase inverter circuit connected to a three-phase motor 102 as an example of a load. The inverter circuit 101 includes a DC power source 103 and a switch part 104.

In this embodiment, the DC power source 103 is, for example, 700 V. A high voltage side wiring 105 is connected to the high voltage side of the DC power source 103, and a low voltage side wiring 106 is connected to the low voltage side of the DC power source 103. The switch part 104 includes three arms 107 to 109 corresponding to respective phases of a U phase 102U, a V phase 102V and a W phase 102W of the three-phase motor 102.

The arms 107 to 109 are connected in parallel between the high voltage side wiring 105 and the low voltage side wiring 106. The arms 107 to 109 respectively include high-side transistors (semiconductor devices 1) 110H to 112H on the high voltage side and low-side transistors (semiconductor devices 1) 110L to 112L on the low voltage side. Regenerative diodes 113H to 115H and 113L to 115L are connected in parallel to the respective transistors 110H to 112H and 110L to 112L in such a direction that a forward current flows from the low voltage side to the high voltage side.

High-side gate drivers 116H to 118H and low-side gate drivers 116L to 118L are connected to the gates of the transistors 110H to 112H and 110L to 112L, respectively. In the inverter circuit 101, it is possible to supply an alternating current to the three-phase motor 102 by alternately switching the on/off control of the high-side transistors 110H to 112H and the low-side transistors 110L to 112L of the respective arms 107 to 109, namely by alternately switching the states in which one of the transistors is switched on and the other transistor is switched off. On the other hand, it is possible to stop the supply of a current to the three-phase motor 102 by switching off both transistors. In this manner, the switching operation of the three-phase motor 102 is performed.

Figure 13:
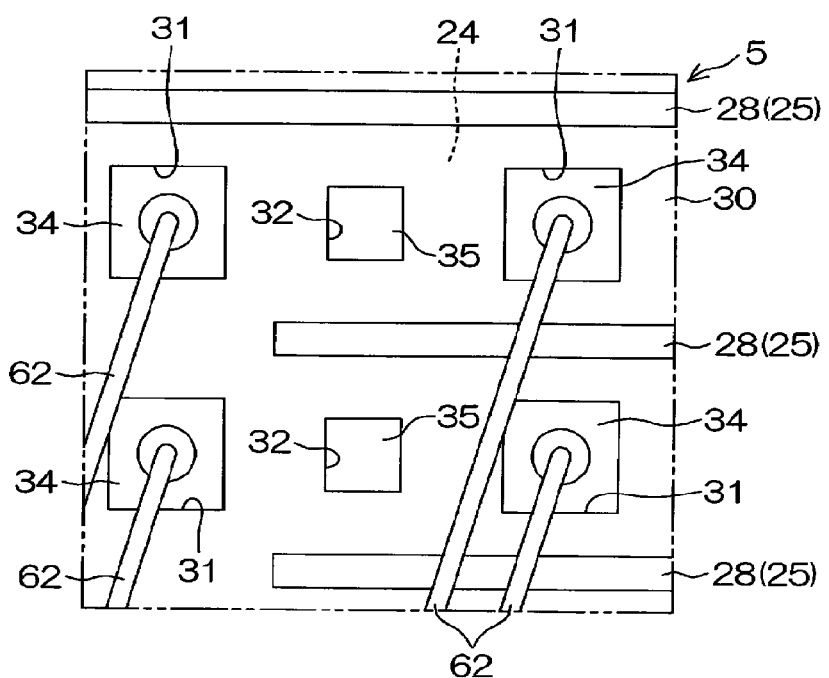
FIG. 13 is a view showing a modification of a source test pad.

While one embodiment of the present disclosure has been described above, the present disclosure may be embodied in other forms. For example, in the above-described embodiment, the source test pad 35 is formed in a circular plan-view shape different from the shape of the source connection pad 34 in order to distinguish the source test pad 35 from the source connection pad 34 having a quadrangular plan-view shape. However, these pads 34 and 35 may have the same shape as long as they can be distinguished from each other. For example, as shown in FIG. 13, the source test pad 35 may be formed in a quadrangular plan-view shape but may be different in size from the source connection pad 34 so that the source connection pad 34 and the source test pad 35 can be distinguished from each other. In FIG. 13, the source test pad 35 is formed to be smaller than the source connection pad 34. Needless to say, the source test pad 35 may be larger than the source connection pad 34. Further, these pads 34, 35 may have a polygonal plan-view shape other than the circular plan-view shape or the quadrangular plan-view shape.

In the above-described embodiment, the bonding wires are used as an example of the bonding members connected to the source connection pad 34 and the gate pad 36. However, the bonding members may be, for example, bonding plates, bonding ribbons, or the like. In the above-described embodiment, the cases of the quadrangular shape and the circular shape are taken as an example of the shapes of the source connection pad 34 and the source test pad 35. However, these pads 34 and 35 may have other shapes. For example, the source connection pad 34 may have a triangular shape and the source test pad 35 may have pentagonal shape. The source connection pad 34 may have a circle shape and the source test pad 35 may have a hexagonal shape.

In the above-described embodiment, the MIS transistor structure is used as an example of the element structure of the semiconductor element 5. However, the element structure may be, for example, an IGBT structure, a JFET structure, or the like. In addition, it is possible to make various design changes within the scope of the subject matters recited in the claims.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A semiconductor device, comprising:
   a semiconductor element;
   a plurality of first bonding pads formed on a surface of the semiconductor element;
   a plurality of test pads formed on the surface of the semiconductor element separately from the plurality of first bonding pads, and configured to be visually distinguishable from the plurality of first bonding pads; and a plurality of first bonding members connected to the plurality of first bonding pads and used for external electrical connection, wherein the plurality of first bonding pads and the plurality of test pads are arranged in a matrix shape, wherein rows of the plurality of first bonding pads and rows of the plurality of test pads are provided separately from each other, wherein the rows of the plurality of first bonding pads and the rows of the plurality of test pads are alternately arranged in a first direction, wherein a row among the rows of the plurality of first bonding pads is arranged to be adjacent to a first row among the rows of the plurality of test pads in the first direction, and wherein the row among the rows of the plurality of first bonding pads is arranged to be adjacent to a second row among the rows of the plurality of test pads in a second direction opposite the first direction.

2. The semiconductor device of claim 1, wherein the plurality of first bonding pads and the plurality of test pads are formed from a single surface electrode film, and the semiconductor device includes a surface insulating film including:

a plurality of first openings formed on the surface electrode film and configured to expose a plurality of first portions of the surface electrode film as the plurality of first bonding pads, and a plurality of second openings configured to expose a plurality of second portions of the surface electrode film as the plurality of test pads.

3. The semiconductor device of claim 2, wherein the surface electrode film is formed using at least one of Al, Cu and Au.

4. The semiconductor device of claim 1, wherein a trace remaining after an electrical inspection of the semiconductor element is formed on surfaces of the plurality of test pads.

5. The semiconductor device of claim 1, wherein the plurality of first bonding members includes a bonding wire.

6. The semiconductor device of claim 5, wherein the plurality of first bonding members includes a Cu wire.

7. The semiconductor device of claim 1, wherein the plurality of first bonding pads has a first shape, and the plurality of test pads has a second shape different from the first shape.

8. The semiconductor device of claim 7, wherein one of the first shape and the second shape is formed in a polygonal shape in a plan view and the other is formed in a circular shape in the plan view.

9. The semiconductor device of claim 1, wherein the plurality of first bonding pads and the plurality of test pads are formed in the same shape and are different in size from each other.

10. The semiconductor device of claim 1, wherein the first bonding pads in the rows of the plurality of first bonding pads are wire-bonded to a single wire bonding portion.

11. The semiconductor device of claim 1, further comprising a resin package and an outer terminal protruding from the resin package, wherein the rows of the plurality of first test pads are arranged to be substantially in line with the outer terminal.

12. A semiconductor device, comprising:

a semiconductor element;

a first bonding pad formed on a surface of the semiconductor element;

a test pad formed on the surface of the semiconductor element separately from the first bonding pad and configured to be visually distinguishable from the first bonding pad; a first bonding member connected to the first bonding pad and used for external electrical connection;

a second bonding pad integrally including a base region formed on the surface of the semiconductor element so as to be electrically insulated from the first bonding pad and having a third shape, and a test region having a fourth shape different in size from the third shape; and a second bonding member connected to the base region and used for external electrical connection.

13. The semiconductor device of claim 12, wherein the test region has a smaller area than the base region and includes a convex region protruding from a peripheral edge of the base region.

14. The semiconductor device of claim 12, wherein the semiconductor element has a transistor structure including a source, a gate and a drain, the first bonding pad and the test pad are electrically connected to the source, and the second bonding pad is electrically connected to the gate.

15. The semiconductor device of claim 12, wherein a trace remaining after an electrical inspection of the semiconductor element is formed on a surface of the test region.

16. The semiconductor device of claim 12, wherein the second bonding member includes a bonding wire.

17. The semiconductor device of claim 16, wherein the second bonding member includes an Au wire.

* * * * *